United States Patent
Atsatt et al.

(10) Patent No.: US 9,537,488 B1
(45) Date of Patent: Jan. 3, 2017

(54) APPARATUS FOR CONFIGURABLE INTERFACE AND ASSOCIATED METHODS

(75) Inventors: Sean R. Atsatt, Sana Cruz, CA (US); Kent Orthner, Santa Cruz, CA (US); Daniel R. Mansur, Emerald Hills, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/105,968

(22) Filed: May 12, 2011

Related U.S. Application Data

(60) Provisional application No. 61/334,562, filed on May 13, 2010.

(51) Int. Cl.
*H03K 19/0175* (2006.01)
*H03K 19/177* (2006.01)

(52) U.S. Cl.
CPC .............................. *H03K 19/017581* (2013.01)

(58) Field of Classification Search
CPC ...................... H03K 19/17732; H03K 19/1776; H03K 19/177; H03K 19/17744; H03K 17/223; H03K 19/17736; H03K 19/17796; H03K 19/017581; H03K 19/17728; H03K 19/1778; H03K 19/17748
USPC .................................................. 326/37–41, 47
See application file for complete search history.

(56) References Cited

U.S. PATENT DOCUMENTS

| | | | |
|---|---|---|---|
| 5,812,472 A | 9/1998 | Lawrence et al. | |
| 5,912,852 A | 6/1999 | Lawrence et al. | |
| 6,034,542 A | 3/2000 | Ridgeway | |
| 6,421,251 B1 | 7/2002 | Lin | |
| 7,043,595 B2 | 5/2006 | Kawai | |
| 7,444,454 B2 | 10/2008 | Yancey et al. | |
| 7,493,511 B1 * | 2/2009 | Yin et al. ..................... | 713/600 |
| 7,512,728 B2 | 3/2009 | Tseng | |
| 7,724,028 B1 * | 5/2010 | Ansari et al. .................. | 326/38 |
| 7,724,032 B2 * | 5/2010 | Hutton et al. .................. | 326/41 |
| 7,737,725 B1 * | 6/2010 | Ansari et al. .................. | 326/41 |
| 7,844,761 B1 | 11/2010 | Orthner et al. | |
| 7,912,997 B1 * | 3/2011 | Murray .......................... | 710/22 |
| 7,913,022 B1 * | 3/2011 | Baxter ........................ | 710/305 |
| 2003/0101307 A1 | 5/2003 | Gemelli et al. | |
| 2005/0257031 A1 * | 11/2005 | Kundu et al. ................. | 712/226 |
| 2006/0114022 A1 * | 6/2006 | van Wageningen ........................ H03K 19/17732 | 326/40 |
| 2014/0145758 A1 * | 5/2014 | Atsatt ................ H03K 19/1731 | 326/41 |

OTHER PUBLICATIONS

U.S. Appl. No. 13/105,976, filed May 12, 2011, Atsatt.
"Spartan-6 FPGA Memory Controller User Guide," UG388 (v2.3) Aug. 9, 2010, 66 pp.
"Avalon Interface Specifications," version 1.2, Apr. 2009, 66 pp.
U.S. Appl. No. 12/966,391, filed Dec. 13, 2010, Atstatt et al.
U.S. Appl. No. 14/170,418, filed Jan. 31, 2014, Atsatt et al.

(Continued)

*Primary Examiner* — Jany Richardson

(57) ABSTRACT

An field programmable gate array (FPGA) includes a circuit implemented using the FPGA fabric. The FPGA further includes another circuit implemented as hardened circuitry. The FPGA also includes a configurable interface circuit that is adapted to couple together the two circuits.

20 Claims, 12 Drawing Sheets

(56) References Cited

OTHER PUBLICATIONS

Office communication of Jan. 2, 2013 in U.S. Appl. No. 12/966,391, 8 pp.
Office communication of Feb. 1, 2013 in U.S. Appl. No. 12/966,391, 8 pp.
Office communication of Jun. 19, 2012 in U.S. Appl. No. 13/105,976, 9 pp.
Office communication of Mar. 12, 2013 in U.S. Appl. No. 13/105,976, 10 pp.
Office communication of Nov. 4, 2013 in U.S. Appl. No. 13/105,976, 10 pp.
Office communication in U.S. Appl. No. 14/170,418, Feb. 13, 2015, 8 pgs.
Office communication in U.S. Appl. No. 14/170,418, Nov. 5, 2015, 11 pgs.

* cited by examiner

COMMAND INTERFACE FIELDS

| # Signals | Name | Fields | | Subfields | | Decode |
|---|---|---|---|---|---|---|
| 1 | ready | | | | | |
| 1 | valid | | | | | |
| 32+8 | data | > | cmd (5) address (32) burst(4) | > | rw(1) auto precharge(1) mode(2) wrap(1) | > | normal lock exclusive |
| 8 | channel | | id(8) | | postedwr (1) | | refresh |

FIG. 4

WRITE DATA INTERFACE FIELDS

| # Signals | Name | Symbol | Fields |
|---|---|---|---|
| 1 | ready | | |
| 1 | valid | | |
| 10n | data | < data(10n) < | 8*n bits data<br>n bits byte enable<br>n bit ECC (optionally used) |
| 8 | channel | id(8) | |
| 1 | endofpacket | | |
| 1 | startofpacket | | |

FIG. 5

READ DATA INTERFACE FIELDS

| # Signals | Name | Symbol | Subfields | Decode |
|---|---|---|---|---|
| 1 | ready | | | |
| 1 | valid | | | |
| 10n | data | < data(10n) < | 8*n bits data | |
| | | | n bits rresp  < | okay |
| | | | n bit ECC | exokay |
| 8 | channel | | | slaveerror |
| 1 | endofpacket | | | infraerror |
| 1 | startofpacket | | | |

FIG. 6

WRITE RESPONSE FIELDS

| # Signals | Name | Symbol | Fields |
|---|---|---|---|
| 1 | ready | | |
| 1 | valid | | |
| 2 | data | < resp(2) > | okay<br>exokay<br>error |
| 8 | channel | | |

FIG. 7

```
                      STATUS FIELDS
            #
      Signals   Name          fields
          1     ready
          1     valid
         32     data     <  bank(16)
                            cs(3)
                            idle(1)
                            Channel(8)
```

FIG. 8

MAPPING OF AVALON MM TO INTERFACE BLOCKS

| | ← FPGA Fabric | | | | → | | ← Hardened Circuitry → | |
|---|---|---|---|---|---|---|---|---|
| # | Signal | Mapping | | # | | # | | Command |
| | | | | ready | 1 | | 1 | |
| | | | | valid | 1 | | 1 | |
| 1 | read | cmd (4) | > | data | 32+8 | Source | 32+8 | > | cmd (4) |
| 1 | write | address (32) | | | | | | address (32) |
| 8*n | address | burst(4) | | | | | | burst(4) |
| 4 | burstcount | | | | | | | |
| 1 | arbiterlock | | | channel | 8 | | 8 | id(8) |
| | | | | | ST | | | Write Data |
| | | | | ready | 1 | | 1 | |
| | | | | valid | 1 | | 1 | |
| 8*n | writedata | writedata | > | data | 10n | Source | 10n | < | data(10n) |
| n | byteenable | byteenable() | | | | | | |
| | | | | channel | 8 | | 8 | id(8) |
| | | | | EOP | 1 | | 1 | |
| | | | | SOP | 1 | | 1 | |
| | | | | | ST | | | Read Data |
| | | | | ready | 1 | | 1 | |
| 1 | readdatavalid | | | valid | 1 | | 1 | |
| 8*n | readdata | readdata | < | data | 8n | Sink | 10n | < | data(10n) |
| | | | | channel | 8 | | 8 | |
| | | | | EOP | 1 | | 1 | |
| | | | | SOP | 1 | | 1 | |

FIG. 9

MAPPING OF AXI-3 TO INTERFACE BLOCKS

| | | | | |
|---|---|---|---|---|
| Write Address | | | | |
| AW READY | - | | ready | |
| AWVALID | - | | valid | |
| AWLOCK | / | cmd (4) | > data | Command Interface |
| AWBURST | / | burst(4) | | |
| | | address | | |
| AWLEN | / | (32) | | |
| AWADDR | / | | | |
| AWID | - | | channel | |
| ARPROT | | | | |
| AWSIZE | | | | |
| AWCACHE | | | | |
| Read Address | | | | |
| AR READY | - | | ready | |
| ARVALID | - | | valid | |
| ARLOCK | / | cmd (4) | > data | Command Interface |
| ARBURST | / | burst(4) | | |
| | | address | | |
| ARLEN | / | (32) | | |
| ARADDR | / | | | |
| ARID | - | | channel | |
| ARPROT | | | | |
| ARSIZE | | | | |
| ARCACHE | | | | |
| Write Data | | | | |
| WREADY | - | | ready | |
| WVALID | - | | valid | |
| WDATA | - | wdata | > data | Data Interface |
| WSTRB | - | wstrb | | |
| WID | - | | channel | |
| WLAST | - | | endofpacket | |
| | | | startofpacket | |
| Read Data | | | | |
| RREADY | - | | ready | |
| RVALID | - | | valid | |
| RDATA | - | rdata | < data | Data Interface |
| RRESP | - | rresp | | |
| RID | - | | channel | |
| RLAST | - | | endofpacket | |
| | | | startofpacket | |
| Write Response | | | | |
| BREADY | - | | ready | |
| BVALID | - | | valid | Write Resp |
| BRESP | - | | data | |
| BID | | | channel | |

FIG. 10

APPARATUS FOR CONFIGURABLE INTERFACE AND ASSOCIATED METHODS

CROSS-REFERENCE TO RELATED APPLICATIONS

This application claims priority to, and incorporates by reference, U.S. Provisional Patent Application Ser. No. 61/334,562, filed on May 13, 2010, titled "Composable Field Programmable Gate Array and Associated Methods."

TECHNICAL FIELD

The disclosure relates generally to interfaces in electronic circuitry and, more particularly, to apparatus for configurable interfaces in integrated circuits (ICs), such as field-programmable gate arrays (FPGAs), and associated methods.

BACKGROUND

FPGAs provide designers with flexibility in designing systems for information/data processing. By having the ability to program or configure the FPGA, designers can effectively change the system specifications or performance. Further, end users may configure or program the FPGA to suit their applications.

Typical FPGAs include programmable logic circuitry and interconnect in their fabric. To provide system designers or users with increased functionality or flexibility, some FPGAs also include hardened circuitry. Examples of hardened circuitry include memory controllers, memory, processors, etc.

SUMMARY

The disclosed concepts may be used in a wide variety of embodiments in order to provide configurable interfaces in ICs, such as FPGAs. In one exemplary embodiment, an FPGA includes one circuit that is implemented using the FPGA fabric, and another circuit that is implemented as hardened circuitry. The FPGA also includes a configurable interface circuit that is adapted to couple together the circuit implemented using the FPGA fabric to the circuit implemented as hardened circuitry.

In another exemplary embodiment, an FPGA includes an interface circuit that is adapted to couple the FPGA fabric to hardened circuitry within the FPGA. The interface circuit may include one or more of a command interface block, a data interface block, a write response interface block, and a status interface block.

In yet another exemplary embodiment, a method includes configuring an interface circuit that is coupled to a circuit that is implemented using FPGA fabric to a second circuit that is implemented as hardened circuitry. The interface circuit is adapted to provide communication between the circuit that is implemented using the FPGA fabric to the circuit that is implemented as hardened circuitry.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

FIG. 4 depicts a command interface block arrangement according to an exemplary embodiment.

FIG. 5 illustrates a data interface block arrangement for a write data operation according to an exemplary embodiment.

FIG. 6 depicts a data interface block arrangement for a read data operation according to an exemplary embodiment.

FIG. 7 illustrates a write response interface block arrangement according to an exemplary embodiment.

FIG. 8 shows a status interface block arrangement according to an exemplary embodiment.

FIG. 9 illustrates mapping a protocol to interface blocks according to an exemplary embodiment.

FIG. 10 depicts mapping a protocol to interface blocks according to another exemplary embodiment.

DETAILED DESCRIPTION

The disclosed concepts provide apparatus and associated circuitry for interfacing circuitry or subsystems within FPGAs. FPGAs according to exemplary embodiments include programmable circuitry, e.g., programmable logic and/or programmable interconnect, for example, in the FPGA fabric. One or more circuits (or blocks) may be implemented using the FPGA fabric (FPGA fabric resources, such as programmable logic, programmable interconnect, etc.). In addition, the FPGAs include hardened circuitry or subsystems. One or more circuits (or blocks) may be implemented using the hardened circuitry (hardened circuitry resources, such as processors, memory, controllers, peripherals, etc.). The FPGAs also interface circuitry that provides a mechanism for interfacing one or more circuits implemented in the hardened circuitry with one or more circuits implemented in the FPGA fabric.

Figure 1:
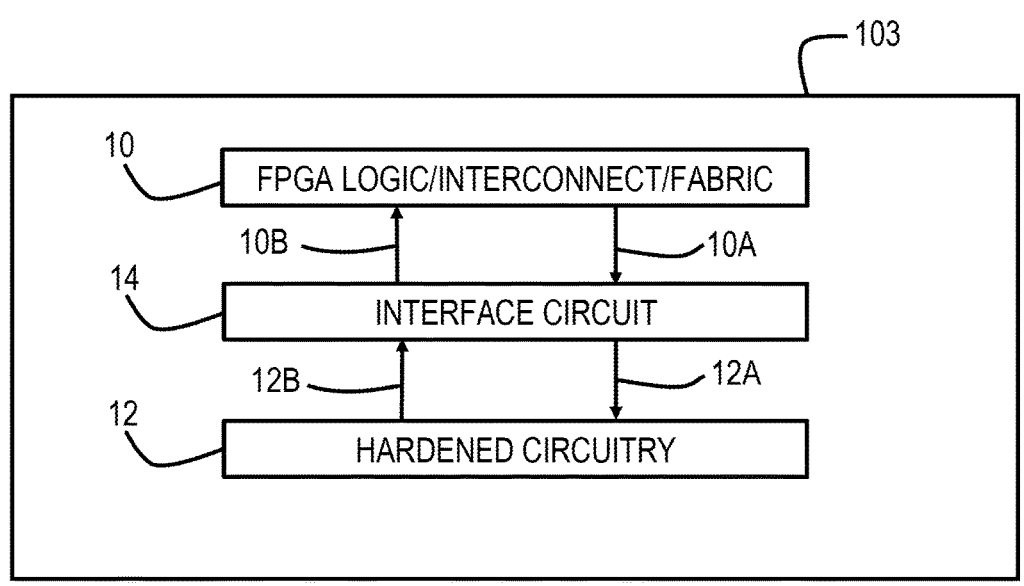
FIG. 1 shows a block diagram of an FPGA including an interface circuit according to an exemplary embodiment.

FIG. 1 shows a block diagram of an FPGA 103 according to an exemplary embodiment. FPGA 103 includes FPGA logic, interconnect, or generally fabric 10. In addition, FPGA 103 includes hardened circuitry 12. Hardened circuitry 12 may include a variety of circuits, blocks of circuitry, and/or subsystems, as persons of ordinary skill in the art understand. Examples include processors, communication circuits, memory, memory controllers, and peripherals.

Interface circuit 14 provides a flexible mechanism for FPGA fabric 10 to communicate with hardened circuitry 12. In exemplary embodiments, FPGA fabric 10 and hardened circuitry 12 may operate in different clock domains or use different clock or operating frequencies. Interface circuit provides a mechanism for communication of data or information from FPGA fabric 10 to hardened circuitry 12, from hardened circuitry 12 to FPGA fabric 10, or between FPGA fabric 10 and hardened circuitry 12 (bi-directional communication), as desired or specified for a given application or implementation.

Through link 10A FPGA fabric 10 may provide data or information to interface circuit 14. Through link 12A interface circuit 14 may provide data or information received from FPGA fabric 10 (or data or information derived from data or information from FPGA fabric 10) to hardened circuitry 12. Likewise, through link 12B, hardened circuitry 12 may provide data or information to interface circuit 14. Through link 10B interface circuit 14 may provide data or information received from hardened circuitry 12 (or data or information derived from data or information from hardened circuitry 12) to FPGA fabric 10.

In some embodiments, communication via interface circuit 14 may provide one-way (in one direction) communication between FPGA fabric 10 and hardened circuitry 12, as desired. For example, in some embodiments, interface circuit 14 may provide a communication path from FPGA fabric 10 to hardened circuitry 12 via links 10A and 12A. As another example, in some embodiments, interface circuit 14 may provide a communication path from hardened circuitry 12 to FPGA fabric 10 via links 12B and 10B.

As described above, interface circuit 14 facilitates communication or interfacing between FPGA fabric 10 and hardened circuitry 12. Interface circuit 14 may constitute one or more ports, such as bus port(s). In some embodiments, interface circuit 14 may be an Avalon ST port, thus following the Avalon ST protocol.

In exemplary embodiments, interface circuit 14 may provide a wide range of use-models and protocols to support the behaviors desired or specified by the user's logic or configuration in FPGA fabric 10 when coupling to various circuits or blocks or subsystems in hardened circuitry 12. Examples of interface protocols between FPGA fabric 10 and hardened circuitry 12 include AMBA AXI, AMBA AHB Lite, Avalon MM, Avalon ST, User Proprietary Protocol, and double data rate (DDR) controller signaling. Those protocols are known to persons of ordinary skill in the art.

As persons of ordinary skill in the art understand, other interface protocols may be used. Furthermore, many variations in use models may be implemented, for example, variations in the number of ports, number of masters, number of slaves, and/or data widths of ports. In exemplary embodiments, a flexible interface and a technique for composing or configuring or designing interfaces that meet a wide range of user specifications using a set of low-level units of interface circuitry made available at the boundary between hardened circuitry 12 and FPGA fabric 10 are provided. Thus, low level interface units (within interface circuit 14) may be used to map efficiently into standard protocols, user protocols, and variable use models, i.e., a configurable or composable interface.

Figure 2:
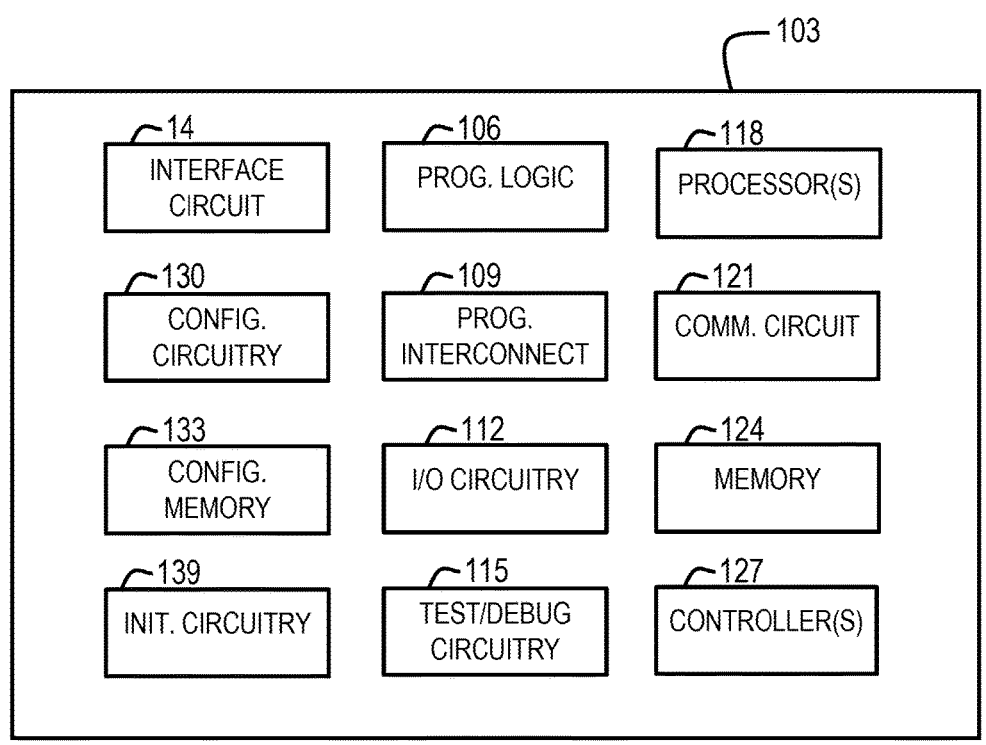
FIG. 2 shows a block diagram of an FPGA according to an exemplary embodiment.

As noted, a variety of circuits, blocks, and/or subsystems may reside in hardened circuitry 12. FIG. 2 shows a block diagram of an FPGA 103 according to an exemplary embodiment. FPGA 103 includes configuration circuitry 130, configuration memory (CRAM) 133, interface circuit 14, programmable logic 106, programmable interconnect 109, and I/O circuitry 112. In addition, FPGA 103 may include test/debug circuitry 115, one or more processors 118, one or more communication circuitry 121, one or more memories 124, one or more controllers 127, and initialization circuit 139, as desired. FPGA 103 may include other blocks and circuitry, as persons of ordinary skill in the art understand. Examples of such circuitry include clock generation and distribution circuits, and the like. Furthermore, FPGA 103 may include, analog circuitry, other digital circuitry, and/or mixed-signal circuitry, as desired.

Programmable logic 106 includes blocks of configurable or programmable logic circuitry, such as look-up tables (LUTs), product-term logic, pass gates, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside FPGA 103 (for example, by using pass gates and/or MUXs).

Initialization circuit 139 may cause the performance of various functions at reset or power-up of FPGA 103. I/O circuitry 112 may constitute a wide variety of I/O devices or circuits. I/O circuitry 112 may couple to various parts of FPGA 103, for example, programmable logic 106 and programmable interconnect 109. I/O circuitry 112 provides a mechanism and circuitry for various blocks within FPGA 103 to communicate with external circuitry or devices. Test/debug circuitry 115 facilitates the testing and troubleshooting of various blocks and circuits within FPGA 103. Test/debug circuitry 115 may include a variety of blocks or circuits known to persons of ordinary skill in the art. For example, test/debug circuitry 115 may include circuits for performing tests after FPGA 103 powers up or resets, as desired. Test/debug circuitry 115 may also include coding and parity circuits, as desired.

FPGA 103 may include one or more processors 118. Processor 118 may couple to other blocks and circuits within FPGA 103. Processor 118 may receive data and information from circuits within or external to FPGA 103 and process the information in a wide variety of ways, as persons skilled in the art understand. One or more of processor(s) 118 may constitute a digital signal processor (DSP). DSPs allow performing a wide variety of signal processing tasks, such as compression, decompression, audio processing, video processing, filtering, and the like, as desired.

FPGA 103 may also include one or more communication circuits 121. Communication circuit(s) 121 may facilitate data and information exchange between various circuits within FPGA 103 and circuits external to FPGA 103, as persons of ordinary skill in the art understand. Examples of communication circuit 121 include transceivers, network interface circuits, etc. FPGA 103 may further include one or more memories 124 and one or more memory controller(s) 127. Memory 124 allows the storage of various data and information (such as user-data, intermediate results, calculation results, etc.) within FPGA 103. Memory 124 may have a granular or block form, as desired. Memory controller 127 allows interfacing to, and controlling the operation and various functions of circuitry outside the FPGA. For example, memory controller 127 may interface to and control an external synchronous dynamic random access memory (SDRAM).

The fabric or core of FPGA 103 may take a variety of forms. In some embodiments, the FPGA fabric 10 may include, among other circuitry, programmable logic 106 and programmable interconnect 109. The programmable logic 106 and programmable interconnect 109 often reside within the FPGA in an array or regular structure, for example, a two-dimensional array. Thus, in some embodiments, the fabric or core of FPGA 103 may be arranged in rows and columns.

FPGA fabric 10 (see FIG. 1) may include one or more of the blocks shown in FPGA 103 in FIG. 2 (or other blocks not shown, as persons of ordinary skill in the art understand), and may take a variety of forms. Examples of such blocks include soft or programmable processor(s) 118, communication circuit(s) 121, memory 124, and/or controller(s) 127.

The choice, number, and configuration of circuitry included in hardened circuitry depends on a number of factors, for example, the end-use, the user's specifications, system implementation considerations, etc., as persons of ordinary skill in the art understand.

Similarly, hardened circuitry 12 may include one or more of the blocks shown in FPGA 103 in FIG. 2 (or other blocks not shown, as persons of ordinary skill in the art understand), and may take a variety of forms. Examples of such blocks include hardened processor(s) 118, communication circuit(s) 121, memory 124, and/or controller(s) 127. The choice, number, and configuration of circuitry included in hardened circuitry depends on a number of factors, for example, the end-use, the user's specifications, system implementation considerations, etc., as persons of ordinary skill in the art understand.

Figure 3:
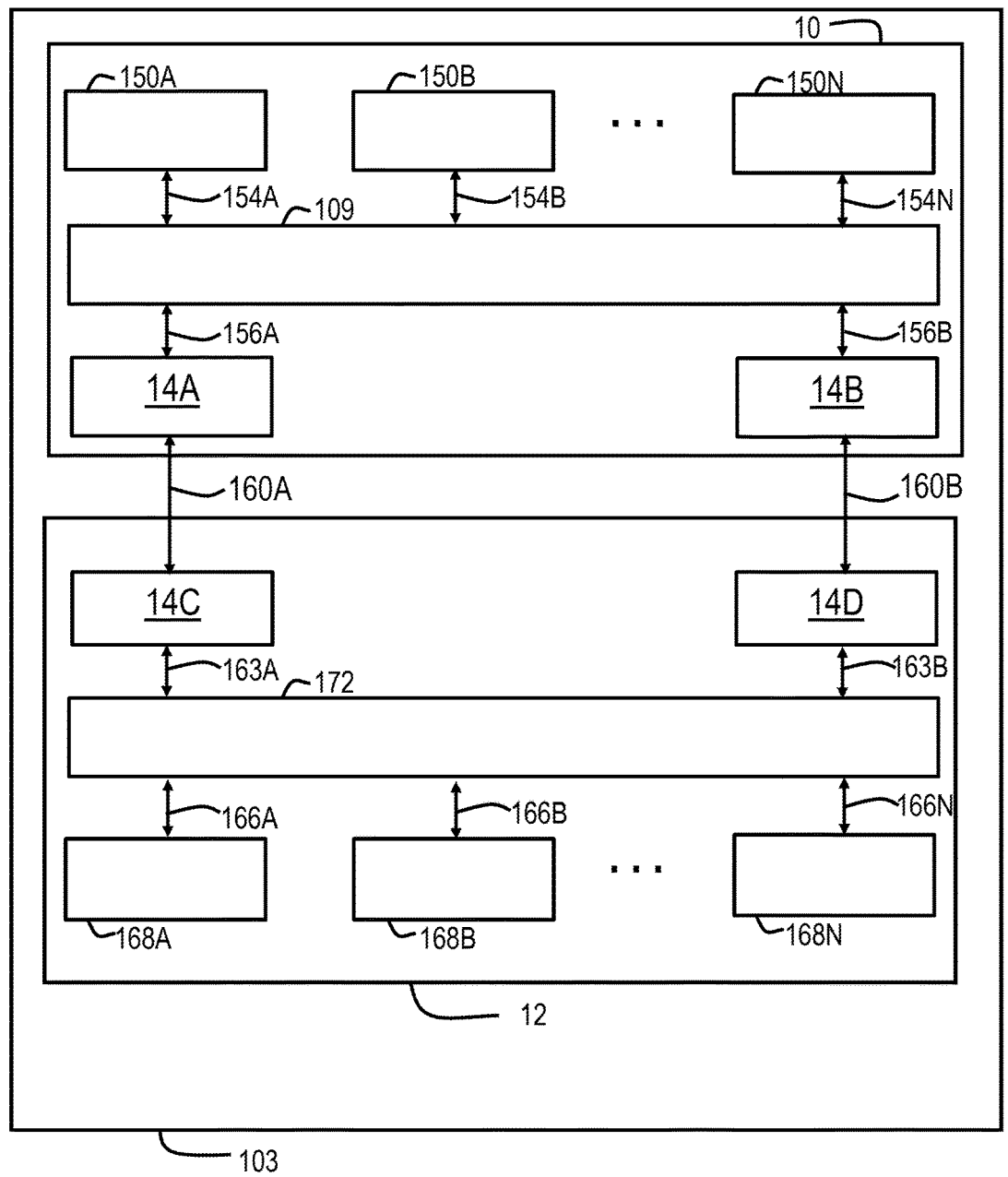
FIG. 3 illustrates depicts a block diagram of an FPGA including an interface circuit according to another exemplary embodiment.

In exemplary embodiments, parts of interface circuit 14 may reside within FPGA fabric and/or hardened circuitry 12. FIG. 3 depicts a block diagram of an FPGA 103 according to another exemplary embodiment that shows such an arrangement. In this embodiment, interface circuits 14A-14D constitute parts or blocks of interface circuit 14. FPGA fabric 10 includes blocks 150A-150N, which couple to programmable interconnect 109 via links 154A-154N, respectively, and communicate with programmable interconnect 109 using a desired protocol, say, Protocol A. Programmable interconnect 109 couples to interface circuits 14A and 14B via links 156A-156B.

Hardened circuitry 12, sometimes called a system on a chip (SOC), may include interface circuits 14C and 14D. Interface circuits 14A and 14B couple to, and communicate with, interface circuits 14C and 14D, respectively, via links 160A and 160B. Interface circuits 14C-14D couple to, and communicate with, interconnect circuit 172 via links 163A-163B, respectively. Interconnect circuit 172 provides a mechanism to couple and provide communication between interface circuits 14C-14D and hardened blocks 168A-168N. Thus, interconnect circuit 172 couples to, and communicates with, hardened blocks 168A-168N via links 168A-168N, respectively, using a desired protocol, say, Protocol B.

Interface circuits 14A-14D (generally interface circuit 14) provide a standard composable interface (or a configurable or composable interface that may be configured to behave like a standard interface) between FPGA fabric 10 and hardened circuitry 12. More specifically, interface circuit 14 may present a standard composable interface to FPGA fabric 10 through a set of interface adapters (one or more of interface circuits 14A-14D), which convert the internal interconnect protocol of hardened circuitry 12 (Protocol B) to the standard composable interface. Programmable logic in FPGA fabric 10 may be constructed or configured by the user to use a desired interconnect protocol, such as the protocols listed above. Similarly, using one or more of interface circuits 14A-14D, an adapter may be constructed or configured in FPGA fabric 10 to convert the composable interface to the chosen FPGA interconnect protocol (Protocol A).

In this manner, flexible composable or configurable interfaces may be provided in FPGA 103. Such interfaces are readily feasible and relatively inexpensive in terms of the hardware used relative to the performance provided, and may support a variety of different or desired protocols.

Note that in the exemplary embodiment shown, either FPGA fabric 10 may be the master and hardened circuitry 12 the slave, or vice-versa. In other embodiments, links 154A-154N, links 156A-156B, links 160A-160B, links 163A-163B, and/or links 166A-166N may provide communication in one direction, depending at least in part on whether FPGA fabric 10 is the master and hardened circuitry 12 the slave, or vice-versa. In exemplary embodiments, the same set of signals in interface circuits 14A-14D (generally interface circuit 14) may be used either for communication from FPGA fabric 10 to hardened circuitry 12, or vice-versa.

Generally, interface circuit 14 may include four types or subtypes of interface unit or block. The four interface blocks include data, command, write response, and status. The four interface blocks may be sourced either from FPGA fabric 10 or from hardened circuitry 12.

Data interface blocks are defined or configured to have a minimum composition width, for example, 32- or 64-bit data words in exemplary embodiments, although other widths may be used. Larger data widths may be composed of several data interface blocks coupled together. Shorter data widths or sub-word writes may be supported by byte enable signals contained in data interface symbols.

A variety of user protocols may be mapped into the defined interface blocks. For example, an Avalon MM protocol may include a command block sourced by FPGA fabric 10 or hardened circuitry 12 for master or slave operation, respectively. Two sets of data blocks may also be used, one set sourced by FPGA fabric 10, and the other set sourced by hardened circuitry 12. As persons of ordinary skill in the art understand, other numbers of data blocks may be used, as the number of blocks depends on the desired or specified data or word width.

As another example, an AXI protocol may include two command blocks, two sets of data blocks, and one write response block. As yet another example, a low level read or write first-in, first-out (FIFO) protocol may include a data block sourced by FPGA fabric 10 or hardened circuitry 12, depending on a read or write operation.

The configurable or composable interface circuits 12 provide a variety of advantages. They allow a set of interface units to be built into hardened circuitry 12 that may be used in a wide range of protocols and use models, with variable data width ports, variable number of ports, variable protocols with minimal or little adaptation in FPGA fabric 10, no or little loss of performance through the interface, and data rate matching between FPGA fabric 10 (relatively slow) and hardened circuitry 12 (relatively fast) system by composing multiple data interface blocks together to aggregate bandwidth from the slower system (using FPGA fabric 10) to the faster system (using hardened circuitry 12). The configurable or composable interface circuits 12 may also provide a layered interface model allowing sophisticated users access to more features and allowing less sophisticated users to connect using higher level standard protocols.

The configurable or composable interface circuits 12 operate in part by exploiting the fact that many (or even all) data movement protocols have a common set of separable functions. Placing some or each of these separable functions into a standard interface allows those separable functions to be managed in a standard way. In exemplary embodiments, the standard interface may constitute the Avalon ST interface.

Avalon ST interfaces use a number of signals, each of which has a defined set of properties, such as type, width, direction, etc. The Avalon ST interface signals include ready, valid, data, channel, and error signals. (In addition, an Avalon ST interface may include signals for packet transfer, including startofpacket, endofpacket, and empty.) Each of the Avalon ST has a prescribed direction, sink-to-source or source-to-sink, The Avalon ST interface, including the above signals, are well known to persons of ordinary skill in the art.

Conceptually, configurable or composable interface circuits 12 according to exemplary embodiments treat the basic Avalon ST interface (including signals ready, valid, data, channel, and error) reduces to a symbol of data with a "Ready" and "Valid" signal. In such a conceptual model, "Valid" is an output used to indicate that the symbol is valid, and "Ready" is an input to indicate that the receiver of the data is ready to accept the data. A more detailed profile of Avalon ST may be realized by adding an End of Packet (EOP) signal and a Start of Packet (SOP) signal to mark the boundaries of a packet of data (for example, in order to mark the start and end of data bursts). Finally, a channel identification (ID) may be added to identify the transaction, allowing association of transactions on different interface blocks, enforcement of ordering, and arbitration rules. Configurable or composable interface circuits 12 according to exemplary embodiments use the characteristics of the Avalon ST interface to describe, configure, or compose a standard or desired interface.

The separation of the interface blocks (data, command, write response, status) into separate physical interfaces may allow for higher performance interface protocols to be implemented with increased flexibility. For example, AXI-3 uses a separate command channel for both reads and writes. Building multiple command channels into a multi-port solution allows these command channels to be used either to construct an AXI-3 interface, multiple lower performance Avalon interfaces, or multiple unidirectional FIFO like interfaces.

The following provides a more detailed description of the command, data, write response, and status interface blocks. The command interface unit is used to transmit the command portion of an interface transaction. Note that a command interface has a direction, either from FPGA fabric 10 to hardened circuitry 12, or vice-versa. The same set of wires may optionally be used to implement a bi-directional command interface by configuring the interface to have a direction based on use model.

FIG. 4 depicts a command interface block arrangement according to an exemplary embodiment. More specifically, the embodiment in FIG. 4 shows an example of a command interface and the fields in the Avalon ST data symbol. FIG. 4 shows the number of signals, the name of the signals (ready, valid, data, and channel), the fields and subfields, if any, for each signal, and the decode values for the fields/subfields (if any). Note that the number of bits in the various signals and fields, for example, the data symbol, will vary based on the extent of use models that are supported at the time FPGA 103 is designed or configured, as persons of ordinary skill in the art understand.

In the example shown, the cmd field holds the command to be executed. The cmd field includes subfields RW (read or write), auto precharge (precharge SDRAM bacnk), mode (described below), wrap (whether the address is wrapping or sequential), and postedwr (indicating that the write transaction is a posted write). In the example shown in FIG. 4, the cmd field (5 bits) is broken down into subfields to support key use models. A use model that does not take advantage of those fields may simply tie the relevant bits to a reference value, such as logic zero. The address, burst, and id fields have 32, 4, and 8 bits in the example shown. The address field holds the address to be read from or written to, while the burst field defines the size of a burst.

In the example shown, the mode subfield has two bits. Accordingly, it may be decoded to four ($2^2$) values, i.e., normal (normal read or write), lock (lock address on current read or write operation), exclusive (mark the address as exclusive on write), and refresh (perform a refresh command on an SDRAM). Note that the subfields support both use models that higher level protocols use (such as exclusive for AXI) as well as use models that lower level protocols, such as a user directly controlling DDR, use (e.g. precharge or refresh request).

Note that the example interface shown in FIG. 4 uses no SOP/EOP as each transaction occurs in a single beat. A channel ID may be provided with each transaction to support the following: (1) Associating a command transaction with a data or write response transaction. This feature assumes that ordering rules (e.g., the ordering rules described below in connection with (4)) are being followed, otherwise an additional transaction ID may be added to allow association between commands and data transactions. (2) Associating a transaction with a specific port. (3) Associating a transaction with a set of arbitration rules or contracts. (4) Associating a transaction with an ordering rule. The ordering rules may includes the following: (a) Any read transactions with the same ID are to be returned in order to a given port. (b) Any read or write hazards are to be prevented for transactions with the same ID from the same port.

The data interface block is used to transfer blocks of data associated with a command. For a given data interface block, the direction of transfer is defined as either from FPGA fabric 10 to hardened circuitry 12, or vice-versa. The direction may be fixed or set at device design or configuration time or, for I/O limited designs the same set of connections can be shared, and the direction can be set at configuration time.

The interpretation of the fields in a data symbol depends on whether it is being used to transfer "read data" or "write data." For write data, a byte enable is provided with each byte, and for read data a status for the n bytes in the symbol is provided. For designs that seek to pass block based error correction code (ECC) data through the interface, one bit per byte in the data symbol may be added, or extra beats at the end of the data transfer may be added to accommodate the communication of the ECC. As persons of ordinary skill in the art understand, appending one bit per byte is sufficient for DDR ECC when n is greater than or equal to eight.

FIG. 5 illustrates a data interface block arrangement for a write data operation according to an exemplary embodiment. The interface includes ready, valid, data, channel, EOP, and SOP signals. The data signal includes the data, byte enable, and ECC fields. The data field includes the data to be written. The byte enable field holds the enable for each byte to be written, defining whether the byte should be written. The ECC field holds the user generated ECC for the data, if user generated ECC is desired or specified.

FIG. 6 depicts a data interface block arrangement for a read data operation according to an exemplary embodiment. The interface includes ready, valid, data, channel, EOP, and SOP signals. The data signal includes the data, rresp, and ECC fields. The data field includes the data read. The rresp field holds the status of the read data. The rresp field may be decoded as okay (the read data are as expected), exokay (the read data are as expected, and they also meet the exclusive access specifications), slaveerror (the slave reported error during the read), and infraerror (interconnect infrastructure reported an error during the read). Note that this encoding for rresp assumes that n is at least two. The ECC field holds the user generated ECC for the data, if user generated ECC is desired or specified.

An implementation according to an exemplary embodiment may have n=8, thus providing a 64 bit data width per interface. This width may be set at the data width of hardened circuitry 12. In exemplary embodiments, it is expected that hardened circuitry 12 would be using a clock frequency higher (e.g., many times faster) than the clock frequency of FPGA fabric 10. Multiple data interfaces may be composed together to (set at configuration time) for rate matching between FPGA fabric 10 and hardened circuitry 12. Furthermore, the number of ports, widths of ports, and bandwidth to masters and slaves may be traded off by assigning more or less data interface blocks than to specific command interface blocks.

As noted above, another type of interface block in exemplary embodiments is the write response block. The write response interface facilitates supporting more advanced protocols by indicating success or failure of a write. The write response interface block has a direction of the interface that is defined at device design time or at configuration time, depending one whether the connections for this interface are to be shared between master and slave.

FIG. 7 illustrates a write response interface block arrangement according to an exemplary embodiment. The interface includes ready, valid, data, and channel signals. The data signals include the resp field, which provides the status signals okay (indicates that the write data are okay (appropriate, proper, etc.), and that a non-posted write has completed), exokay (indicates that the exclusive write command was successful), and error (indicates that the write command failed). Status such as okay, exokay, and error may be used for some protocols, such as higher level protocols, to support non-posted writes, exclusive access, and security measures.

As noted above, interface circuit 14 according to exemplary embodiments may also include the status interface block. The status interface block allows transaction-independent or subsystem wide information to pass between hardened circuitry 12 and the FPGA fabric 10. As an example, information that would indicate the status of a hard DDR controller and indicate information on what transaction has won arbitration may be communicated using the status interface block. Also, an FPGA fabric arbitrated protocol may use the status interface block to determine what transactions to arbitrate into hardened circuitry 12.

FIG. 8 shows a status interface block arrangement according to an exemplary embodiment. The interface includes ready, valid, and data signals. The data signals include the bank (indicates the bank open state of a SDRAM), cs (indicates the state of the chip select lines to coupled to the SDRAM), idle (indicates that the memory controller is idle with no pending transactions), and Channel (indicates the ID of the current transaction of the SDRAM interface) fields.

In the example shown in FIG. 8, channel indicates the channel ID of the current DDR transaction. Idle indicates that no transactions are queued and valid is asserted when time a DDR burst is initiated (or on each clock cycle idle is asserted). This scheme allows logic circuitry in FPGA fabric 10 to perform scheduling into each port based on status of a DDR controller in hardened circuitry 12.

Note that the example shown in FIG. 8 pertains to providing status signals for a memory transaction. As persons of ordinary skill in the art understand, however, in other embodiments, a variety of other or additional types of status signals may be provided, depending on a given implementation or end-use.

As noted, in exemplary embodiments, a given protocol may be mapped using interface blocks in interface circuit 14. FIG. 9 shows the mapping of the Avalon MM protocol to three interface blocks, i.e., the command, write data, and read data interface blocks. The mapping is performed in FPGA 103 when an Avalon interface is coupled to a port (implemented by circuitry in FPGA 103). Using the mapping, interface circuit allows the Avalon MM to be coupled to and communicate with hardened circuitry 12. The following list shows the correspondence between the mapped signals:

read || write ↔ command ready
cmd(0) ↔ write (cmd (3:1)=000)
burst ↔ burstcount
port number ↔ channel
arbiterlock ↔ not supported
write ↔ data ready
writedata ↔ writedata
Adapter burst counter ↔ write data EOP and SOP
byteenable ↔ bytenable
readdatavalid ↔ read data ready
readdata ↔ read-data data FIG. 10 depicts mapping a protocol to interface blocks according to another exemplary embodiment. Specifically, FIG. 10 shows mapping of the AXI interface to a set of five interface blocks in interface circuit 14. The five interface blocks include two command interface blocks, two data interface blocks, and a write response interface block. FIG. 10 shows the correspondence between the AXI interface signal and the interface block signals. For example, signals AW READY and AWVALID of the AXI correspond, respectively, to signals ready and valid of the interface. A dash in FIG. 10 indicates a one-to-one correspondence between the AXI and interface signals. (AXI signals (e.g., ARPROT) that do not have a corresponding interface signal in FIG. 10 are not supported by the embodiment shown.) AXI signals ARLEN and ARBURST are combined in the soft logic in FPGA fabric 10 to create the data interface burst length, and that the command is created from the ARLOCK signal.

Figure 11:
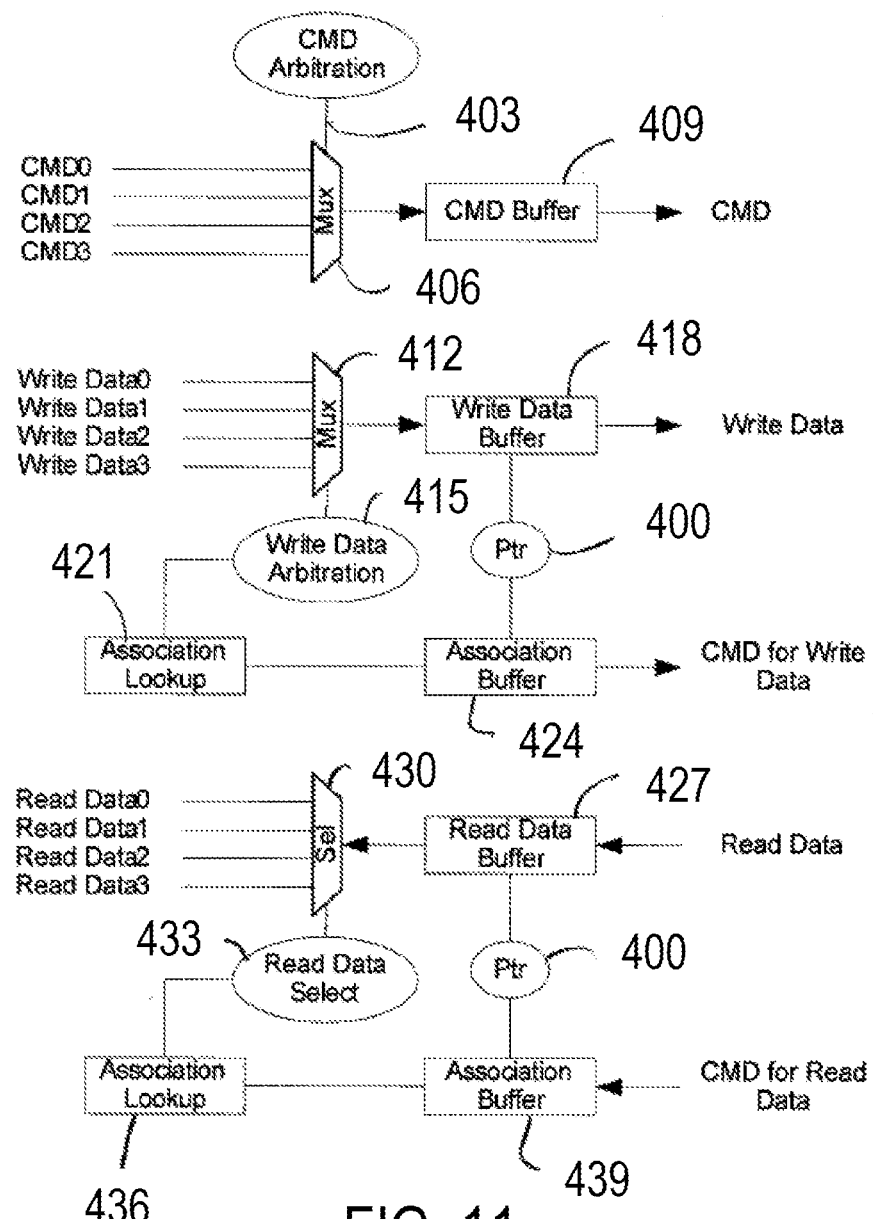
FIG. 11 shows a configurable interface according to an exemplary embodiment.

As noted, interface blocks in interface circuit 14 may be combined to support a wide variety of interfaces. An example of such interfaces includes configurable multi-port interfaces. FIG. 11 shows a configurable interface according to an exemplary embodiment. In this embodiment, a command interface (CMD), a write data interface, and a read data interface are supported. Depending on a command provided at inputs CMD0-CMD3, a write or read operation may be performed.

In response to CMD arbitrations signal(s) 403, multiplexer (MUX) 406 provides command signals to CMD buffer 409, which then outputs the command CMD. In cooperation with association lookup block 421, MUX 412 accepts Write Data0-Write Data3 and in response to select signal(s) from Write Data Arbitration block 415 provides the write data to write data buffer 418, which then provides the write data as an output. In cooperation with association lookup block 421, association buffer 424 provides the command for the write data operation. The read data operation operates in a similar way. In cooperation with association buffer 439 and association lookup block 436, read data select block 433 provides select signal(s) to MUX 430. In response, MUX 430 provides read data buffered by read data buffer 427, and routes the read data to an appropriate one of outputs Read Data0-Read Data3. Pointers 400 point to appropriate locations in the respective buffers to which they couple.

An association lookup table in an association lookup block (e.g., in association lookup blocks 421 and 436) may be set at configuration time, and defines which data ports are associated with a specific command interface. When a write data operation wins arbitration, an association lookup table defines the CMD and the number of write data ports associated with that CMD. When read data is returned, the lookup data defines how it is to be distributed on the ports.

Table 1 below provides an example of an association lookup table showing Avalon MM protocol usage. The table assumes each data interface is 64 bits wide. The table assigns CMD0 to a 64-bit write only port, CMD1 is assigned to a 128-bit read/write port, and CMD2 to a 64-bit read/write port.

TABLE 1

|       | Write Data 0 | Write Data 1 | Write Data 2 | Write Data 3 | Read Data 0 | Read Data 1 | Read Data 2 | Read Data 3 |
|-------|---|---|---|---|---|---|---|---|
| CMD 0 | 1 | 0 | 0 | 0 | 0 | 0 | 0 | 0 |
| CMD 1 | 0 | 1 | 1 | 0 | 0 | 1 | 1 | 0 |
| CMD 2 | 0 | 0 | 0 | 1 | 0 | 0 | 0 | 1 |
| CMD 3 | 0 | 0 | 0 | 0 | 0 | 0 | 0 | 0 |

Table 1 defines how data are moved across the interface independent of CMD arbitration by defining how the ports are grouped, and what CMD signal tags data moving across the port should have. The table also defines the data width matching that should occur through the port. Arbitration logic may give preference to write data that is associated with commands that are winning arbitration. As another example, Table 2 below shows the ports used to implement a single 128-bit wide AXI interface, assuming 64-bit wide data interfaces.

TABLE 2

|       | Write Data 0 | Write Data 1 | Write Data 2 | Write Data 3 | Read Data 0 | Read Data 1 | Read Data 2 | Read Data 3 |
|-------|---|---|---|---|---|---|---|---|
| CMD 0 | 1 | 1 | 0 | 0 | 0 | 0 | 0 | 0 |
| CMD 1 | 0 | 0 | 0 | 0 | 1 | 1 | 0 | 0 |
| CMD 2 | 0 | 0 | 1 | 1 | 0 | 0 | 0 | 0 |
| CMD 3 | 0 | 0 | 0 | 0 | 0 | 0 | 1 | 1 |

Figure 12:
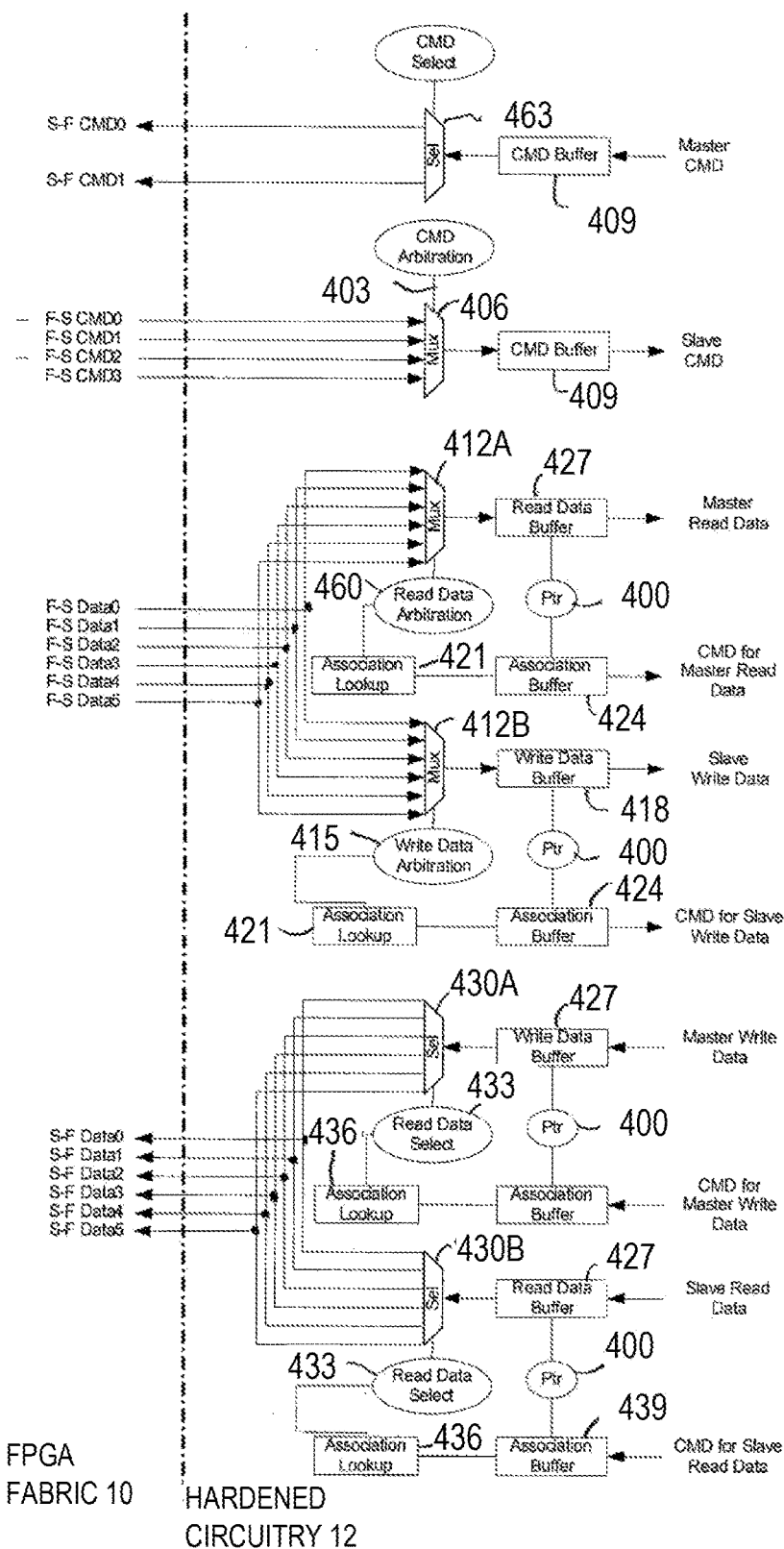
FIG. 12 illustrates a configurable interface according to another exemplary embodiment.

FIG. 12 illustrates a configurable interface according to another exemplary embodiment. More specifically, FIG. 12 shows how a set of interface blocks (part of interface circuit 14) may be used to support a configurable multi-port solution where the read and write data are shared between a master and a slave. The embodiment shown operates similarly to the embodiment of FIG. 11, but MUXs 430A-430B, MUXs 412A-412B, read data arbitration block 460, and MUX 463 are used to accommodate the presence of both a master and a slave. In the embodiment shown in FIG. 12, the same data port interfaces can be used by either a master or a slave for reading data or writing data, respectively. This arrangement allows the allocation of data interfaces to master and slave interfaces to be set at configuration time of FPGA 103. In the embodiment shown, the master CMD interface includes two CMD channels. The number of command channels may be selected when hardened circuitry 12 is created in order to meet the maximum bandwidth specification in each direction. Note that, depending on the relative clock frequencies and performance capabilities of FPGA fabric 10 and hardened circuitry 12, other implementations may be used where buffers are placed before MUXs and select logic.

As persons of ordinary skill in the art understand, one may apply the disclosed concepts effectively to various types of electronic circuits. Examples described in this document (FPGAs) constitute merely illustrative applications, and are not intended to limit the application of the disclosed concepts to other ICs, which falls within the level of skill of persons of ordinary skill in the art. Examples of such ICs include programmable logic devices (PLDs), complex PLDs (CPLDs), structured application specific ICs (ASICs), and the like.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. A field programmable gate array (FPGA), comprising:
   a first circuit in the FPGA, the first circuit implemented using FPGA fabric, the first circuit operating in a first clock domain;
   a second circuit in the FPGA, the second circuit implemented as hardened circuitry, the second circuit operating in a second clock domain; and
   a configurable interface circuit in the FPGA, the configurable interface circuit adapted to couple the first circuit to the second circuit, wherein the configurable interface circuit interfaces with the first circuit using a first protocol and interfaces with the second circuit using a second protocol, while providing data rate matching between the first and second circuits.

2. The FPGA according to claim 1, wherein the configurable circuit comprises one or more of a command interface block, a data interface block, a write response interface block, and a status interface block.

3. The FPGA according to claim 1, wherein the first circuit comprises programmable logic, programmable interconnect, or both.

4. The FPGA according to claim 1, wherein the second circuit comprises a processor, a memory, a controller, or a peripheral.

5. The FPGA according to claim 1, wherein the command interface block, the data interface block, the write response interface block, and/or the status interface block define a set of fields adapted to interface the first circuit to the second circuit.

6. The FPGA according to claim 1, wherein the first circuit is adapted to operate according to the first protocol.

7. The FPGA according to claim 6, wherein the second circuit is adapted to operate according to the second protocol.

8. The FPGA according to claim 1, wherein the first circuit is adapted to operate at a first frequency and the second circuit is adapted to operate at a second frequency, wherein the second frequency is higher than the first frequency.

9. A field programmable gate array (FPGA), comprising an interface circuit implemented in the FPGA, the interface circuit adapted to couple FPGA fabric to hardened circuitry within the FPGA, the interface circuit comprising one or more of a command interface block, a data interface block, a write response interface block, and a status interface block used by the interface circuit to interface with the FPGA fabric using a first protocol and to interface to the hardened circuitry using a second protocol, wherein the FPGA fabric operates in a first clock domain, and the hardened circuitry operates in a second clock domain, and wherein the interface circuit provides data rate matching between the first and second circuits.

10. The FPGA according to claim 9, wherein the interface circuit defines a plurality of fields adapted to interface the FPGA fabric to the hardened circuitry.

11. The FPGA according to claim 10, wherein a set of fields in the plurality of fields are adapted to correspond to an Avalon ST protocol.

12. The FPGA according to claim 9, wherein the hardened circuitry is adapted to communicate according to AMBA AXI, AMBA AHB Lite, or Avalon MM protocol.

13. The FPGA according to claim 9, wherein the hardened circuitry is adapted to communicate according to a user-defined protocol.

14. A method, comprising configuring an interface circuit implemented in a field programmable gate array (FPGA), the interface circuit coupled to a first circuit implemented using FPGA fabric, the first circuit operating in a first clock domain, and to a second circuit implemented as hardened circuitry in the FPGA, the second circuit operating in a second clock domain, wherein the interface circuit is adapted to provide communication between the first and second circuits while providing data rate matching between the first and second circuits, and wherein the configurable interface circuit interfaces with the first circuit using a first protocol and interfaces with the second circuit using a second protocol.

15. The method according to claim 14, further comprising using the interface circuit to provide communication from the first circuit to the second circuit.

16. The method according to claim 14, further comprising using the interface circuit to provide communication from the second circuit to the first circuit.

17. The method according to claim 14, wherein configuring the interface circuit comprises configuring a data interface block, a command interface block, a write response interface block, and/or a status interface block.

18. The method according to claim 17, wherein configuring the interface circuit comprises configuring the interface circuit for operation according to AMBA AXI, AMBA AHB Lite, Avalon MM, or a user-defined protocol.

19. The method according to claim 14, wherein the FPGA fabric comprises programmable logic and/or programmable interconnect.

20. The method according to claim 14, wherein the hardened circuitry comprises a processor, a memory, a controller, or a peripheral.

* * * * *